United States Patent [19]

Revelli et al.

[11] Patent Number: 5,691,116
[45] Date of Patent: Nov. 25, 1997

US005691116A

[54] PATTERN TRANSFER TECHNIQUES FOR FABRICATION OF LENSLET ARRAYS FOR SOLID STATE IMAGERS

[75] Inventors: Joseph F. Revelli; Jeffrey L. Hirsh; Joseph Jech, all of Rochester; Douglas R. Robello, Webster; Stephen P. Barry, Albion; Alan C. G. Nutt, Rochester, all of N.Y.

[73] Assignee: Eastman Kodak Company, Rochester, N.Y.

[21] Appl. No.: 710,591

[22] Filed: Sep. 20, 1996

Related U.S. Application Data

[63] Continuation of Ser. No. 369,235, Jan. 6, 1995, Pat. No. 5,605,783.

[51] Int. Cl.$^6$ ........................................... G03F 7/00
[52] U.S. Cl. ............................................ 430/321; 216/26
[58] Field of Search ............................ 430/321; 359/619, 359/620, 644; 216/26; 257/432

[56] References Cited

U.S. PATENT DOCUMENTS 4,689,291  8/1987  Popovic et al. .......................... 430/321

FOREIGN PATENT DOCUMENTS

| | | |
|---|---|---|
| 60-263458 | 12/1985 | Japan . |
| 3297167 | 4/1990 | Japan . |
| 3-021901 | 1/1991 | Japan . |
| 4226073 | 5/1991 | Japan . |

OTHER PUBLICATIONS

Y. Ishihara et al., "A High Photosensitivity IL-CCD Image Sensor with Monolithic Resin Lens Array," International Electron Devices Meeting, 1983, pp. 497–500.

J. M. Moran and D. J. Maydan (Journal of Vacuum Science Technology, 1979, 16, pp. 1620–1624).

"Electronic and Photonic Properties of Polymers," M. J. Bowden and S. R. Turner, eds., American Chemical Society: Washington, DC, 1978, pp. 158–166.

*Primary Examiner*—John A. McPherson
*Attorney, Agent, or Firm*—Raymond L. Owens

[57] ABSTRACT

A method for forming lenslets which collect light and focus the light onto photosensitive elements of an electronic imager. The method includes providing a transparent lenslet-forming layer on a substrate or on layers on the substrate, forming a thin etch-stop layer on the transparent lenslet-forming layer and patterning a thin photosensitive resin mask on the etch-stop layer so that the mask pattern corresponds to lenslets to be formed. The method further includes transferring by etching the pattern of the photosensitive resin mask to the thin etch-stop layer to form a thin etch-stop mask, anisotropically plasma etching the transparent lenslet-forming layer according to the patterned thin etch-stop mask, removing the thin etch-stop mask, and thermally reflowing the etched transparent lenslet-forming layer to form the lenslets.

2 Claims, 3 Drawing Sheets

PATTERN TRANSFER TECHNIQUES FOR FABRICATION OF LENSLET ARRAYS FOR SOLID STATE IMAGERS

CROSS REFERENCE TO RELATED APPLICATION

This application is a continuation of commonly assigned U.S. application Ser. No. 08/369,235, entitled "Pattern Transfer Techniques For Fabrication Of Lenslet Arrays For Solid State Imagers" by Joseph F. Revelli et al., filed Jan. 6, 1995, now U.S. Pat. No. 5,605,783.

FIELD OF THE INVENTION

The present invention relates to methods of forming lenslet arrays for solid state image sensors.

BACKGROUND OF THE INVENTION

Solid state imagers consist of two principal parts: an image-forming part (i.e., a lens) and an image-capture part (i.e., an electronic image sensor device). The image is projected by the lens onto the surface of the electronic image sensor device at which surface the image is divided uniformly into many small picture elements or "pixels." These pixels are quite small and typically range in size from less than ten microns to over 100 microns across. The electronic image sensor itself is typically a silicon chip upon which an array of photodiodes has been fabricated such that each pixel is associated with a single photodiode element.

A subset of electronic sensors are known as "interline" devices. In these devices the area of the photodiode is significantly less than that of the pixel. A lightshield is placed over the pixel area except in the photodiode region to prevent light from entering other light-sensitive device elements such as the transfer gate or the shift register which are within the pixel area but outside the photodiode. Consequently any light that falls on a particular pixel outside the photodetector area cannot be captured unless some sort of optical condensing element such as a lenslet is positioned between the light source and the photodetector. The desired characteristics of the lenslet array are 1) the lenslets must be properly aligned with respect to the photodiode array, 2) the lenslets must be properly spaced from the photodiode, or, alternatively, the index of refraction and the radius of curvature must be such that the resulting focal length of the lenslet is approximately equal to the distance between the lenslets and the photodiodes, 3) the lenslets must be optically transparent and remain so in ambient conditions, 4) the lenslets must be as closely spaced as possible to minimize non-captured light, and 5) the lenslets must be as uniform as possible.

Integrated microlens structures and fabrication processes were disclosed by Y. Ishihara et al., "A High Photosensitivity IL-CCD Image Sensor with Monolithic Resin Lens Array," International Electron Devices Meeting, 1983, pp. 497–500, for cylindrical lenslet arrays and Popovic et al., U.S. Pat. No. 4,689,291, for spherical lenslet arrays. Aspects of both of these methods are summarized in FIG. 1. According to FIG. 1A, a thick layer of photosensitive resin is deposited on an organic planarization/spacer layer 14 and then photolithographically patterned into stripe-like (former case) or cylinder-like lenslet precursor structures 12 (latter case). The organic planarization/spacer layer 14 itself is deposited directly on the surface of the solid-state image sensor. It will be understood that the planarization/spacer layer 14 could be deposited on top of other layers which have been deposited on the surface of the solid state sensor. These additional layers could include patterned dye color filter arrays (such as might be found in color solid state imaging devices), light shield layers, or other planarization layers. These cylinder-like lenslet precursor structures 12 are then heated sufficiently to cause them to reflow, thereby forming semi-cylinder or semi-spherical lenslets 16 (see FIG. 1B). There are several problems with this way of forming lenslet arrays. First of all, especially for electronic color imagers, typical photosensitive resins contain components which absorb in the blue region of the visible spectrum. This results in a distortion of the color spectrum or "yellowing" of the scene that is "seen" by the photodetector array through an adjacent array of color filters. Moreover, the color distortion increases with time due to oxidation of the resin. A second difficulty with this method of forming lenslet arrays is that the resolution with which the photosensitive resin can be patterned is limited by the thickness of the resin layer. The thicker the resin layer, the farther apart the lenslets in the array and, consequently, the less the light collection efficiency of the array. On the other hand, the resin layer must be thick enough so that, when reflowed, the sag of the resultant lenslets is sufficient to cause the desired focusing effect. Accordingly, it is not possible to obtain the highest possible collection efficiency with lenslet arrays fabricated in this manner.

Alternative lenslet fabrication techniques have been proposed which avoid some of the difficulties mentioned above. In these techniques the photolithographic patterning and lens-forming functions are separated. The photosensitive resin serves as both the patterning means and the lens-forming means in the aforementioned technique.

FIG. 2 illustrates an alternative scheme disclosed by Y. Hokari in Japanese Kokai Patent Application No. Hei 4[1992]-226073. In the figure, a lenslet-forming layer 18 is made of a transparent inorganic material such as $SiO_2$ which is deposited on the surface of an organic planarizing spacer layer 14 which is in turn deposited on the surface of the electronic image sensor chip. A thick photosensitive resin layer is then deposited on lenslet-forming layer 18 and patterned to form lenslet precursors 12 (FIG. 2A). The resin precursors are subsequently transformed into semi-spherical shapes 16 by thermal reflowing (FIG. 2B). As shown in FIG. 2C, inorganic transparent lenslets 20 are then created by transferal of the lens-shaped pattern formed by the reflowed resin to the lenslet-forming layer 18 by reactive ion etching. Next, $SiO_2$ is deposited selectively only on the surfaces of the inorganic transparent lenslets 20 by means of well-known "spin on glass" or SOG techniques to form lenslet coveting films 22 which is shown in FIG. 2D. In this fashion, the spacing between the lenslets can be effectively reduced to zero thereby increasing the light capturing efficiency of the lenslets. One difficulty with this method is the formation of thick layers (i.e. 10 microns) of inorganic materials such as $SiO_2$ especially on organic bases. Deposition techniques such as RF (radio frequency) sputtering require several hours of deposition time to form such thick layers. During such lengthy deposition times the organic base can become hot enough to decompose. Furthermore, thick layers of inorganic materials tend to be mechanically unstable and crack or peel, especially when deposited on organic bases. In addition, films of SOG can require treatment at temperatures as high as 400° C. in order to become fully densified. Clearly the high temperatures associated with thick film inorganic layer deposition are incompatible with both the electronic image sensor substrate and the organic layers. Finally, it is extremely difficult to control the reactive ion etch conditions in order to transfer the lens pattern in the organic resin faithfully to the inorganic layer. Exact etch conditions must be found for which the etch rates of the organic and inorganic materials are identical. Deviations from these conditions or nonuniformity of the etch conditions will result in the formation of unacceptable lenslet arrays. Reactive ion etching can also result in unacceptably rough lenslet surface finishes.

Another alternative scheme for lenslet fabrication is described by H. Kawashima et al. in Japanese Kokai Patent Application No. Hei 3[1991]-297167. Referring to FIG. 3, a thick (i.e., several microns) transparent inorganic planarization/spacer layer 24 is deposited on the surface of the electronic image sensor chip. A thick (i.e., 2 to 10 micron) lenslet-forming layer 26 is then deposited on the planarization/spacer layer 24. This lenslet-forming layer is made of a transparent thermoplastic resin such as PMMA (polymethylmethacrylate), PGMA (polyglycidylmethacrylate), PMIPK (polymethylisopropenylketone), etc. Next a first photosensitive resin layer 28 is deposited on the lenslet-forming layer as shown in FIG. 3A. After photolithographically patterning the first photosensitive resin layer, the pattern is transferred to the lenslet-forming layer by means of oxygen plasma etching (FIG. 3B). The patterned photosensitive resin layer 28 behaves as an etch-stop for the oxygen plasma etch process. The first photosensitive resin etch-mask 30 is removed with a release solution (ethanol, acetone, etc.) leaving lenslet precursor structures 32 in the thermoplastic resin. The transparent microlens array is then created by thermally reflowing the lenslet precursor structures to form semi-spherical structures 34 which are shown in FIG. 3C. The disclosure goes on to describe the application and patterning of a second photosensitive resin etch-mask 36 which is shown in FIG. 3D. A wet etch solvent is used to remove unwanted portions of the transparent inorganic planarization/spacer layer 38 and the residual resist is removed with a solvent such as ethanol as shown in FIG. 3E. Patterning of the planarization/spacer layer is necessary in order to provide access to electrical contacts of individual electronic imagers. Several of these imagers are fabricated on a single silicon wafer which is subsequently diced into separate devices. If the planarization/spacer layer is patterned prior to spin-coating the lenslet-forming layer, non-uniform coating of the lenslet-forming layer results. This in turn causes nonuniformity of the lenslet array. The fabrication sequence described in FIG. 3 is designed to avoid this problem.

As mentioned with respect to the previously cited reference of Hokari, the deposition of thick inorganic layers is usually problematical due to the long deposition times or high processing temperatures or both. The Kawashima reference also suffers from the fact that most organic photosensitive resins are not immune to erosion by oxygen plasma etching. This lack of selectivity implies that the resin mask will erode as the thick thermoplastic resin layer is being etched and will result in poorly formed lenslet precursor structures and consequently poorly formed semi-spherical lenslets. Even if the selectivity of the photosensitive resin were to be sufficient to withstand exposure to the lengthy oxygen plasma etch process, the difficulty of removing the residual resist prior to reflowing the thermoplastic resin and after patterning the inorganic planarization/spacer layer is problematical. Solvents that are used to remove the photoresists (i.e., ethanol, acetone) can also dissolve the organic thermoplastic resin.

SUMMARY OF THE INVENTION

It is therefore an object of the present invention to provide lenslet arrays for image sensors which eliminate the above noted difficulties.

This object is achieved by a method for forming lenslets which collect light and focuses it onto photosensitive elements of an electronic imager, comprising the steps of:

(a) providing a transparent lenslet-forming layer on a substrate or on layer(s) on the substrate;

(b) forming a thin etch-stop layer of a material selected from the group consisting of silicon dioxide, silicon nitride, silicon, and spin-on organometallic glasses on the transparent lenslet-forming layer and patterning a thin photosensitive resin mask on the etch-stop layer so that the mask pattern corresponds to lenslets to be formed;

(c) transferring by etching the pattern of the photosensitive resin to the thin etch-stop layer;

(d) anisotropically plasma etching the transparent lenslet-forming layer according to the patterned thin etch-stop layer;

(e) removing the thin etch-stop layer; and (f) thermally reflowing the etched transparent lenslet-forming layer to form the lenslets.

In accordance with the present invention, completely transparent microlenses can be formed in a closely packed array such that light incident on said array can be efficiently collected and focused onto the electronic sensor photodetector array. Moreover, the present invention allows sufficient flexibility in the choice of materials which constitute the lenslet array so that physical parameters such as index of refraction and softening temperature can be varied so as to optimize performance and utility of the electronic sensor device.

Several advantages of the present invention will be appreciated. First of all, the optical and physical properties of the lenslet-forming material can be selected independently of the properties of the photosensitive pattern-forming layer. Because of this flexibility, it is possible to select the lenslet-forming material in such a way as to optimize the performance of the imager. For example, the index of refraction can be selected which gives rise to optimum light collection efficiency or the $T_g$ (glass transition temperature) can be chosen such that subsequent thermal steps or applications involving heating to elevated temperatures would not degrade lenslet shape or performance. This means that optically transparent non-yellowing lenslets can be formed. Furthermore, the time required to sputter deposit thin inorganic etch-stop layers is very brief which reduces the manufacturing costs relative to the above-mentioned patents which require thick inorganic layers. In addition, the brief deposition time of thin inorganic etch-stop layers means that substrate heating is limited. Furthermore, thin layers of inorganic materials deposited on organic bases tend to be more stable mechanically than thick inorganic layers. In addition, thin etch-stop layers are easier to remove after the oxygen plasma RIE (reactive ion etching) than thicker layers would be.

As mentioned previously, only very thin photosensitive resin and etch-stop layers are required in the present invention. The photosensitive resin is used only as an intermediate masking layer for the very thin etch-stop layer. The etch-stop layer can be very thin owing to its high degree of resistance to the oxygen plasma etch. This means that the thin photosensitive resin and the thin etch-stop layers can be patterned with much higher resolution than would be possible with thicker layers. Replication of this resolution in the transparent organic lenslet-forming layer is made possible by virtue of the near-verticality of the oxygen plasma etched walls. Consequently the lenslets can be formed much closer together than would be otherwise possible. It will be appreciated that this is achieved without the need for over coating with additional thick inorganic layers as in the case of the prior art due to Hokari.

Yet another advantage of the present invention is that the thin photosensitive resin layer is automatically removed during the oxygen plasma etching process which transfers the patterned etch-stop structure to the transparent lenslet-forming layer. Thus the need to employ resin removal solvents which could dissolve away the lenslet layer is eliminated. This is a clear advantage over the previously-cited prior art due to Kawashima.

DETAILED DESCRIPTION OF THE PREFERRED EMBODIMENTS

In the present invention, use is made of the so-called "trilayer" processing technique to avoid many of the difficulties associated with prior art. Trilayer reactive ion etching-portable conformable mask (RIE-PCM) systems have been known for some time in the IC industry as a means of forming structures with high aspect ratios in organic planarizing layers. J. M. Moran and D. J. Maydan (Journal of Vacuum Science Technology, 1979, 16, pp 1620–1624) were the first to demonstrate the versatility and process compatibility of trilayer $SiO_2$ RIE-PCM. The critical processing steps of the trilayer RIE-PCM system include spin-coating a thick organic planarization/spacer layer, plasma CVD (chemical vapor deposition) or RF sputter-coating a thin layer of inorganic material such as $SiO_2$ (typically a few hundred Å in thickness), spin-coating the photosensitive resin layer, exposing through the appropriate mask, developing the pattern, etching the exposed inorganic material, and transferring the pattern to the organic layer by means of oxygen plasma RIE. The advantage of this process is that only a thin layer of photosensitive resin is required to pattern the thin inorganic layer. The thin inorganic layer in turn acts as an etch-stop or etch-mask for the oxygen plasma RIE and the anisotropic nature of the etch results in near vertical walls in the thick organic planarization/spacer layer.

Figure 1A:
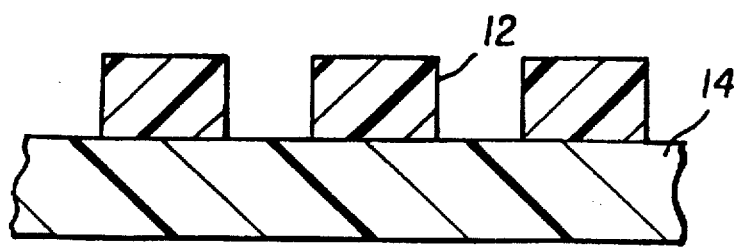
FIGS. 1A and 1B show various steps in a conventional process for forming lenslets.
Figure 1B:
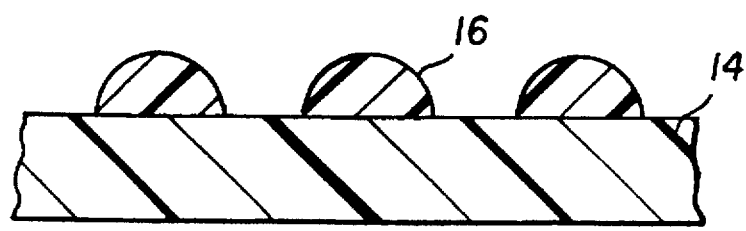
Figure 2A:
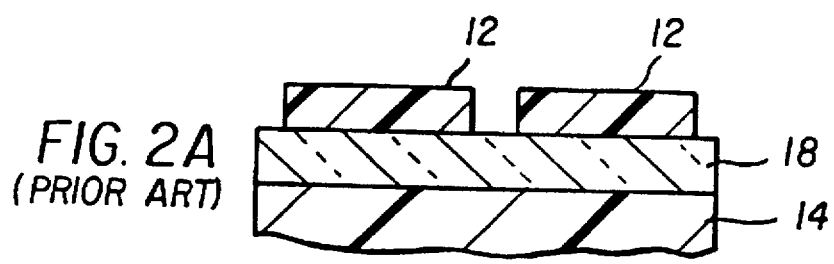
FIG. 2 shows a series of steps (A–D) in another conventional process for forming lenslets.
Figure 2B:
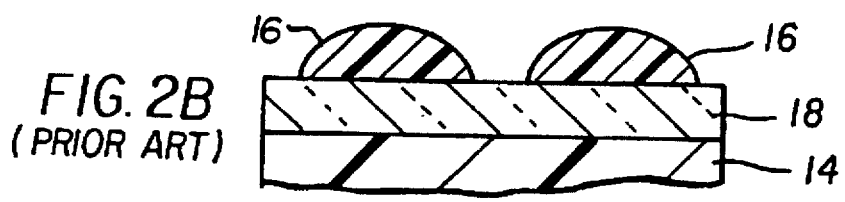
Figure 2C:
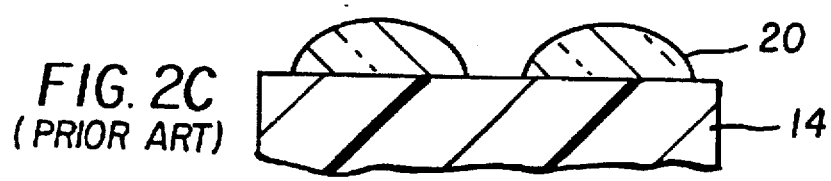
Figure 2D:
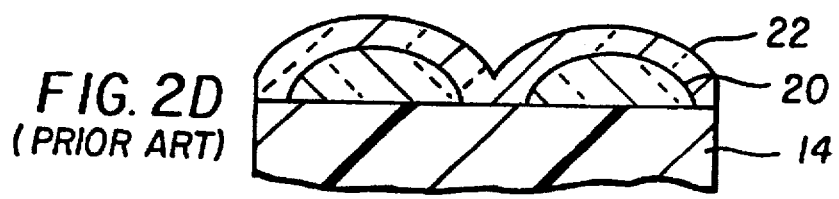
Figure 3A:
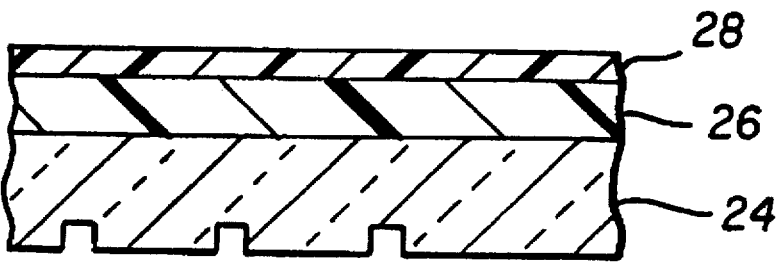
FIG. 3 shows a series of steps (A–E) in yet another prior method for forming lenslets.
Figure 3B:
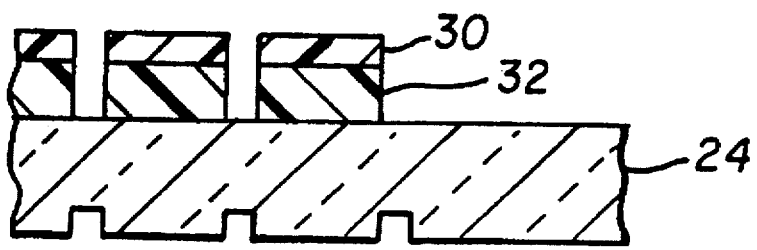
Figure 3C:
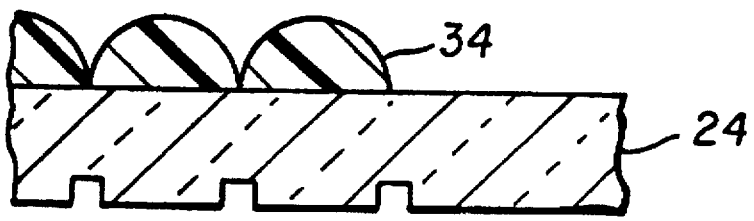
Figure 3D:
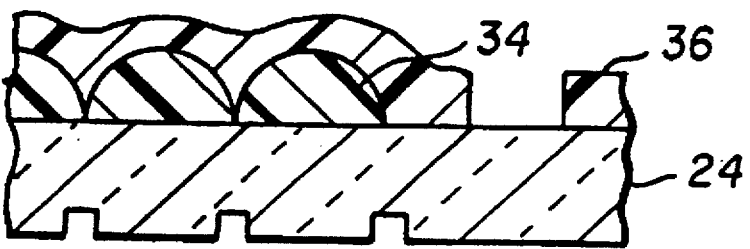
Figure 3E:
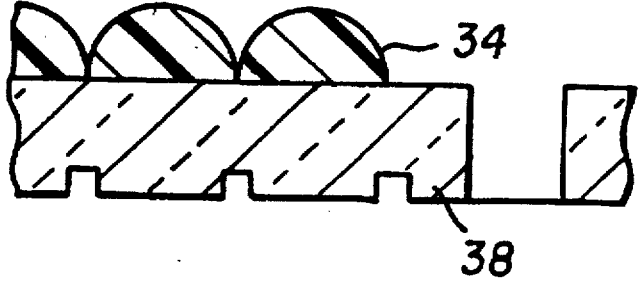
Figure 4A:
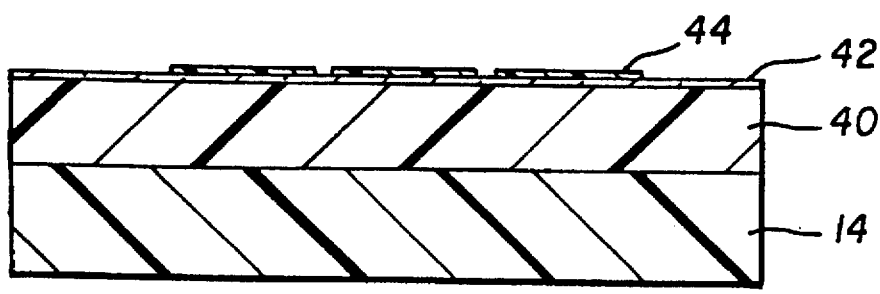
FIG. 4 shows a series of steps (A–E) for forming lenslets in accordance with the present invention
Figure 4B:
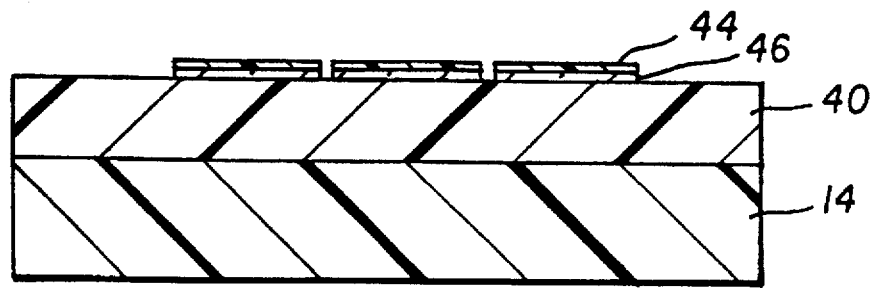
Figure 4C:
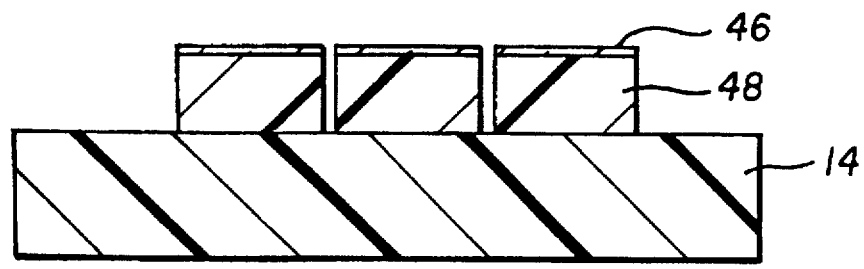
Figure 4D:
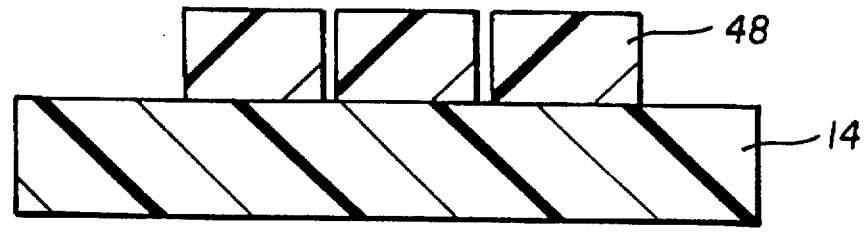
Figure 4E:
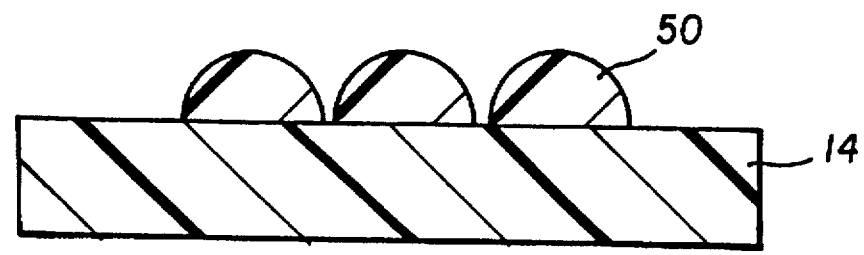

The key aspects of the present invention are illustrated with the help of FIG. 4. An organic planarization/spacer layer 14 is spin-coated on the silicon chip followed by a transparent organic lenslet-forming layer 40. As mentioned previously, it is understood that planarization/spacer layer 14 could be deposited on layer(s) that have been formed on the silicon chip substrate. The organic lenslet-forming layer can be any transparent polymer or other thermoplastic resin. The only constraints on the organic material chosen for this layer are that 1) it should maintain transparency under ambient conditions, i.e., it should not discolor due to oxidation or any other mechanisms, 2) it should have a sufficiently high index of refraction, 3) it should exhibit a glass softening temperature $T_g$ such that it will reflow at temperatures high enough to exceed the highest subsequent wafer process temperature and low enough that existing organic structures and electronic elements will not be damaged, and 4) it should be free from metallic elements that form impervious oxides during oxygen plasma etching. Typical candidates for the transparent lenslet-forming layer could be any one of a number of organic materials such as polyacrylates or methacrylates, polycarbonates, polyesters, polyolefins, polystyrenes, polyimides, polyurethanes, polyethers, polyamides, polysulphones, or even evaporated or spun-on low molecular weight organic glasses among others. Following the deposition of the transparent lenslet-forming layer 40 is the deposition of a thin layer 42 of inorganic material such as $SiO_2$. This layer needs to be only 100 to 500 Å in thickness and can be deposited by one of several means including RF-sputtering, plasma CVD, thermal evaporation, or SOG. It will be appreciated that this thin inorganic layer serves as a temporary etch-stop and need not necessarily be restricted to $SiO_2$. Other candidate inorganic etch-stop materials include, but are not restricted to, $Si_3N_4$, silicon, amorphous carbon, or organometallic glasses and polymers. Following the etch-stop layer, a thin layer of photosensitive resin is spin-coated on the laminate structure. It will be further appreciated that this photosensitve layer need not be very thick: a photosensitve resin layer as thin as one or two thousand Å would be sufficient. This is possible because the photoresist is used merely to pattern the etch-stop layer and is not used to form the lenslet itself. As shown in FIG. 4A, the photosensitive resin is exposed with a suitable mask and developed. The thin photosensitive resin mask pattern 44 is subsequently transferred to the thin etch-stop layer 42 by either wet- or dry-etch techniques to form the thin etch-stop mask 46 (FIG. 4B) and transferred once again by means of oxygen plasma etching to the transparent organic lenslet-forming layer (FIG. 4C). The thin inorganic etch-stop mask 46 serves as a highly selective etch-stop and protects the organic material below from etching by the oxygen plasma. It will be still further appreciated that due to the high degree of anisotropy of the oxygen plasma RIE and the high selectivity of the inorganic etch-stop, the etched walls of the lenslet-forming layer will be nearly vertical giving rise to well-defined lenslet footprints and permitting smaller separations between the individual lenslets. This results in greater effective light collection area or, alternatively speaking, greater collection efficiency for each lenslet. The etch process is terminated after a prescribed time interval chosen such that the interval is adequate for the transparent lenslet-forming layer to be completely removed in those areas unprotected by the inorganic etch-stop mask. It will be still further appreciated that the duration of the oxygen plasma etch is not critical; it is unimportant if the planarization/spacer layer 14 is partially etched in the regions between the lenslets since none of the light incident upon these areas will be collected anyway. After removal of the patterned thin inorganic etch-stop mask by means of standard wet or dry etch techniques, transparent lenlets precursor structures 48 of the lenslet-forming material are left as shown in FIG. 4D. The shapes of these structures are changed to approximately semi-spherical shapes 50 by thermally reflowing the organic transparent lenslet-forming material (FIG. 4E).

As mentioned previously, it is usually necessary to pattern the organic planarization/spacer layer to allow for electrical interconnects to the individual imagers. One possibility is to pattern the organic planarization/spacer layer prior to the lenslet fabrication sequence depicted in FIG. 4. However, this procedure is undesirable since it can result in nonuniform lenslet sag as mentioned earlier in connection with the previously-cited reference of Kawashima. Another possibility would be to employ the method proposed in the same Kawashima reference; namely, spin-coat a second photoresist layer on top of the completed lenslet array, expose the resist with the appropriate pattern, etch the planarization/ space layer, and finally remove the resist with a suitable solvent. Unfortunately, this is not a desirable method either since the application and removal of the resist are likely to cause dissolution of the completed organic lenslets.

It will be appreciated by those skilled in the art that the trilayer RIE-PCM processing procedures outlined above in the preferred embodiment of the invention could be replaced by trilayer Deep-UV PCM procedures. In this case, the inorganic thin film etch-stop layer would be replaced by a thin film of a material that is deep-UV blocking such as germanium-selenium or silicon. Furthermore the lenslet-forming layer would have to be deep-UV sensitive.

It will be further appreciated that the photosensitive resin layer and the etch-stop layer in the preferred embodiment of the present invention could be replaced by a single photosensitive resin layer containing metallic elements such as silicon or tin. In the preferred embodiment, the process step illustrated in FIG. 4A could be eliminated entirely. Thin photosensitive resin mask 44 and thin inorganic etch-stop mask 46 in FIG. 4B would be replaced with a single thin (i.e. 2000 to 6000 Å thick) photosensitive resin layer containing metallic elements. Photosensitive materials containing metallic elements can be spin-coated, exposed, and developed in the usual manner. When exposed to oxygen RIB, these materials are partially converted to refractory metal oxides that can serve as an etch-stop material in place of the thin layer of $SiO_2$ or other inorganic material previously described. For example, any of the metal-containing photoresist materials reviewed by T. Iwayanagi, et. al. (from "Electronic and Photonic Properties of Polymers," M. J. Bowden and S. R. Turner, eds., American Chemical Society: Washington D.C., 1988, pp 158–166) might be employed. This alternate practice has the advantage of combining the functions of the photosensitive resin and the etch-stop layers, thereby providing a simpler process. On the other hand, it exhibits a disadvantage in that the complex metallic oxide/organo-metallic polymer remaining after oxygen RIB is difficult to strip away. This material can only be removed by freon RIB followed by oxygen RIB or alternatively by RIB using a gas containing a mixture of both oxygen and freon. A second disadvantage is that the resolution obtainable with the alternative process is not as high as that of the trilayer process previously described.

The invention has been described in detail with particular reference to a preferred embodiment thereof, but it will be understood that variations and modifications can be effected within the spirit and scope of the invention.

| PARTS LIST | |
|---|---|
| 12 | photosensitive resin lenslet precursor |
| 14 | organic planarization/spacer layer |
| 16 | photosensitive resin lenslet |
| 18 | inorganic transparent lenslet-forming layer |
| 20 | inorganic transparent lenslet |
| 22 | inorganic lenslet covering film |
| 24 | inorganic planarizatioin/spacer layer |
| 26 | organic transparent lenslet-forming layer |
| 28 | first photosensitive resin layer |
| 30 | first photosensitive resin etch-mask |
| 32 | organic transparent lenslet precursor |
| 34 | organic transparent lenslet |
| 36 | second photosensitive resin etch-mask |
| 38 | inorganic planarization/spacer pad |
| 40 | organic transparent lenslet-forming layer |
| 42 | thin inorganic etch-stop layer |
| 44 | thin photosensitive resin mask |
| 46 | thin inorganic etch-stop mask |
| 48 | organic transparent lenslet precursor |
| 50 | organic transparent lenslet |

We claim:

1. A method for forming lenslets which collect light and focus light onto photosensitive elements of an electronic imager, comprising the steps of:

(a) providing a transparent lenslet-forming layer on a substrate or on layer(s) on the substrate;

(b) forming a thin etch-stop layer of a spin-on organo-metallic glass on the transparent lenslet-forming layer and patterning a thin photosensitive resin mask on the etch-stop layer so that the mask pattern corresponds to lenslets to be formed;

(c) transferring by dry etching the pattern of the photosensitive resin mask to the thin etch-stop layer to form a thin etch-stop mask;

(d) anisotropically plasma etching the transparent lenslet-forming layer according to the patterned thin etch-stop mask;

(e) removing the thin etch-stop mask; and (f) thermally reflowing the etched transparent lenslet-forming layer to form the lenslets.

2. The method of claim 1 wherein the transparent lenslet-forming layer is an organic polymer selected from the group consisting of:

(a) polyacrylates;
   (b) polycarbonates;
   (c) polyesters;
   (d) polyolefins;
   (e) polystyrenes;
   (f) polyimides;
   (g) polyurethanes;
   (h) polyethers;
   (i) polyamides;
   (j) polysulphones; and
   (k) polymethacrylates.

* * * * *